(12) United States Patent
Kang

(10) Patent No.: US 7,136,315 B2
(45) Date of Patent: Nov. 14, 2006

(54) BANK SELECTABLE PARALLEL TEST CIRCUIT AND PARALLEL TEST METHOD THEREOF

(75) Inventor: Tae Jin Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 53 days.

(21) Appl. No.: 11/085,173

(22) Filed: Mar. 22, 2005

(65) Prior Publication Data

US 2005/0207245 A1 Sep. 22, 2005

(30) Foreign Application Priority Data

Mar. 22, 2004 (KR) ........................ 10-2004-0019245

(51) Int. Cl.
*G11C 29/00* (2006.01)
(52) U.S. Cl. .................. 365/201; 365/191; 365/230.03
(58) Field of Classification Search ................ 365/201, 365/191, 230.03, 230.08, 230.01
See application file for complete search history.

(56) References Cited

U.S. PATENT DOCUMENTS

| | | | |
|---|---|---|---|
| 5,987,635 A * | 11/1999 | Kishi et al. ................. | 714/724 |
| 6,166,967 A | 12/2000 | Do | |
| 6,262,928 B1 | 7/2001 | Kim et al. | |
| 6,389,563 B1 | 5/2002 | Oh et al. | |
| 6,400,623 B1 | 6/2002 | Ohno | |
| 6,483,760 B1 | 11/2002 | Kang | |
| 6,484,289 B1 | 11/2002 | Hsu | |
| 6,662,315 B1 | 12/2003 | Gradinariu et al. | |
| 6,693,841 B1 | 2/2004 | Roohparvar et al. | |
| 6,762,615 B1 | 7/2004 | Lee et al. | |
| 6,853,597 B1 | 2/2005 | Jain | |
| 2004/0184327 A1 * | 9/2004 | Okuda ........................ | 365/199 |
| 2005/0041493 A1 | 2/2005 | Maeda | |

FOREIGN PATENT DOCUMENTS

| | | |
|---|---|---|
| JP | 2000-030491 | 1/2000 |
| JP | 2001-222898 | 8/2001 |
| KR | 91-10835 | 2/1993 |

* cited by examiner

*Primary Examiner*—Richard Elms
*Assistant Examiner*—Dang Nguyen
(74) *Attorney, Agent, or Firm*—Heller Ehrman LLP

(57) ABSTRACT

A parallel test circuit performs a selective test on a specific bank. The bank selectable parallel test circuit comprises a bank selecting control unit and a plurality of bank selecting units. The bank selecting control unit outputs a test mode control signal for selecting a test mode in response to a parallel test signal for controlling a parallel test and a compression test signal for controlling bank selection in the parallel test. Each of the plurality of bank selecting units, which correspond one by one to banks, selectively activates the corresponding banks in response to the test mode control signal and a bank selecting control signal.

19 Claims, 11 Drawing Sheets

<Prior Art>

BANK SELECTABLE PARALLEL TEST CIRCUIT AND PARALLEL TEST METHOD THEREOF

BACKGROUND OF THE INVENTION

1. Field of the Invention

The present invention generally relates to a memory test circuit, and more specifically, to a parallel test circuit for selectively testing a desired specific bank as well as all banks in a parallel test on a semiconductor chip integrated on a silicon wafer and a parallel test method thereof.

2. Description of the Prior Art

When a test is performed on a semiconductor memory device, the test time is determined depending on the number of chips that can be test at one time. As a result, a parallel test method has been used because the test time can be reduced if the number of data input/output pins used in the test is decreased.

In the above-described parallel test method, data are written in all cells using a test code after entry of a test mode, and then defects of the chip are tested by compressing and reading each data.

FIG. 1 is a block diagram illustrating a read operation of a conventional parallel test method.

At a parallel test, 16 bit data of each bank B0~B3 (EVEN/ODD) are compressed and outputted through corresponding one of data pads DQ2, DQ6, DQ9 and DQ13. Here, one bank is divided into half banks EVEN/ODD. Here, a low level signal is outputted if the chip is fail, and a high level signal is outputted if the chip is pass.

FIG. 2 is a circuit diagram illustrating a conventional parallel test circuit, and FIG. 3 is a circuit diagram illustrating a bank selecting unit 12, 14, 16 and 18 of FIG. 2.

The parallel test circuit of FIG. 2 comprises bank selecting units 12, 14, 16 and 18 which correspond one by one to banks. Each of the bank selecting units 12, 14, 16 and 18 selectively activates the corresponding bank in response to bank selecting control signals BA0, BA1 and a parallel test signal PTS.

In other words, each of the bank selecting units 12, 14, 16 and 18 selectively activates a desired bank in response to the bank selecting control signals BA0 and BA1 when the parallel test signal PTS is disabled to 'low'. When the parallel test signal PTS is enabled to 'high', each of the bank selecting units 12, 14, 16 and 18 outputs bank selecting signals Out0~Out3 as 'low' regardless of the bank selecting control signals BA0 and BA1 so that all the banks B0~B3 may be selected at the same time.

Referring to FIG. 3, each of the bank selecting units 12, 14, 16 and 18 comprises PMOS transistors P1~P3 and NMOS transistors N1~N3. The PMOS transistors P1, P2 and the NMOS transistors N1, N2 are connected serially between a power voltage PWR terminal and a ground voltage GND terminal. Gates of the PMOS transistors P1 and P2 receive the parallel test signal PTS and the bank selecting control signal BA1, respectively. Gates of the NMOS transistors N1 and N2 receive the banks selecting control signals BA0 and BA1, respectively. The PMOS transistor P3 connected in parallel to the PMOS transistor P2 has a gate to receive the bank selecting signal BA0. The NMOS transistor N3 connected between an output terminal Out and the ground voltage GND terminal has a gate to receive the parallel test signal PTS.

FIG. 4 is a timing diagram illustrating data write and read operations in the conventional parallel test.

After a test mode register set signal TMRS for representing entry of the parallel test mode is applied, data applied through the data pads DQ2, DQ6, DQ9 and DQ13 are simultaneously written in all the banks B0~B3 in response to a write signal. In response to a read signal, the data written in each bank B0~B3 are respectively compressed and outputted through the data pads DQ2, DQ6, DQ9 and DQ13. That is, in the conventional parallel test circuit, data of the four banks are respectively outputted through one corresponding data pad at the same time.

As mentioned above, since all banks are simultaneously selected at the parallel test in the conventional parallel test circuit, only a specific bank cannot be selectively tested and the dependency on banks cannot be found in the wafer. Additionally, correlation of data cannot be found in comparison with other chips, either.

SUMMARY OF THE INVENTION

Accordingly, it is an object of the present invention to selectively test a specific bank in a parallel test mode by improving a structure of a parallel test circuit.

In an embodiment, a bank selectable parallel test circuit comprises a bank selecting control unit and a plurality of bank selecting units. The bank selecting control unit outputs a test mode control signal for selecting a test mode in response to a parallel test signal for controlling a parallel test and a compression test signal for controlling bank selection in the parallel test. Each of the plurality of bank selecting units, which correspond one by one to banks, selectively activates the corresponding banks in response to the test mode control signal and a bank selecting control signal to selectively test a specific bank even in a parallel test mode.

In an embodiment, a parallel test method comprises the steps of: performing a logic operation on a parallel test signal for controlling a parallel test and a compression test signal for controlling bank selection to output a test mode control signal; activating all bank selecting signals when the test mode control signal is activated to simultaneously select all banks, and activating a bank selecting signal corresponding to a specific bank in response to a bank selecting control signal when the test mode control signal is inactivated to select a corresponding bank; writing/reading data in the selected bank to test the selected bank.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 5:
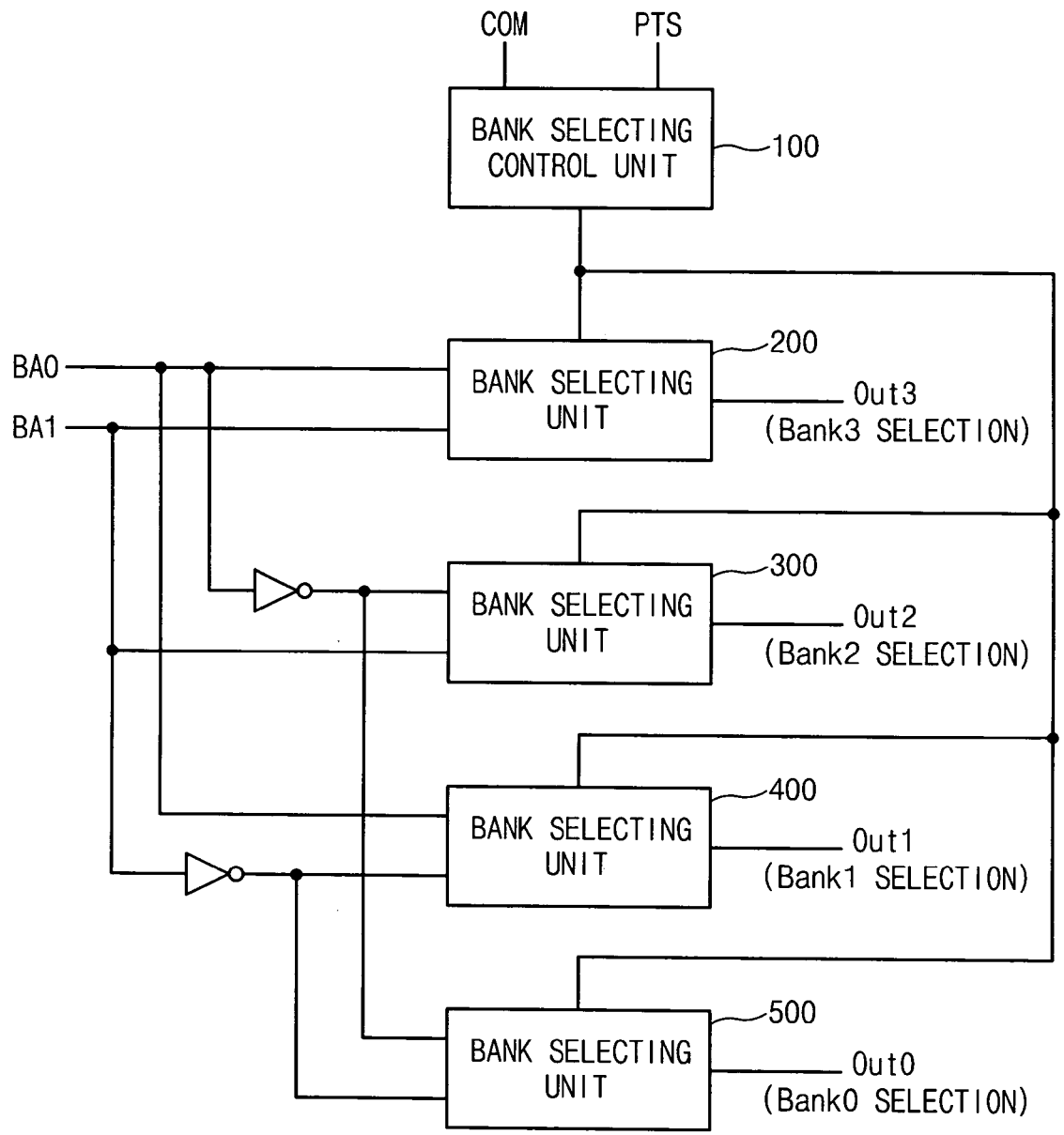
FIG. 5 is a circuit diagram illustrating a parallel test circuit according to an embodiment of the present invention.

FIG. 5 is a circuit diagram illustrating a parallel test circuit according to an embodiment of the present invention.

In an embodiment, the parallel test circuit comprises a bank selecting control unit 100 and a plurality of bank selecting units 200~500.

At a parallel test, the bank selecting control unit 100 generates a test mode control signal TMS for selecting test modes such as an all bank test mode and a partial bank test mode in response to a parallel test signal PTS and a compression test signal COM, and outputs the test mode control signal TMS to the bank selecting units 200~500. Here, the all bank test mode refers to when the test mode control signal TMS is outputted at a high level. At the all bank test mode, the bank selecting units 200~500 generate output signals Out0~Out3 all at low levels, respectively, to select and test all banks B0~B3 at the same time. The partial bank test mode refers to when the test mode control signal TMS is outputted at a low level. At the partial bank test mode, only one of the output signals Out0~Out3 from the bank selecting units 200~500 is outputted at the low leveling in response to bank selecting control signals BA0 and BA1, so that only the corresponding bank is selected and tested. Here, although the compression test signal COM is a signal related to the input/output compression operation, the compression test signal COM according to an embodiment of the present invention is used to control the test mode control signal TMS.

The bank selecting units 200~500 corresponding one by one to the banks B0~B3 output the bank selecting signals Out0~Out3 for selectively activating the corresponding banks B0~B3 in response to the test mode control signal TMS and the bank selecting control signals BA0, BA1. Here, since the bank selecting control signals BA0, BA1 are bank addresses to select banks and used as control signals in an embodiment of the present invention, the signals BA0 and BA1 are represented by bank selecting signals.

Figure 6:
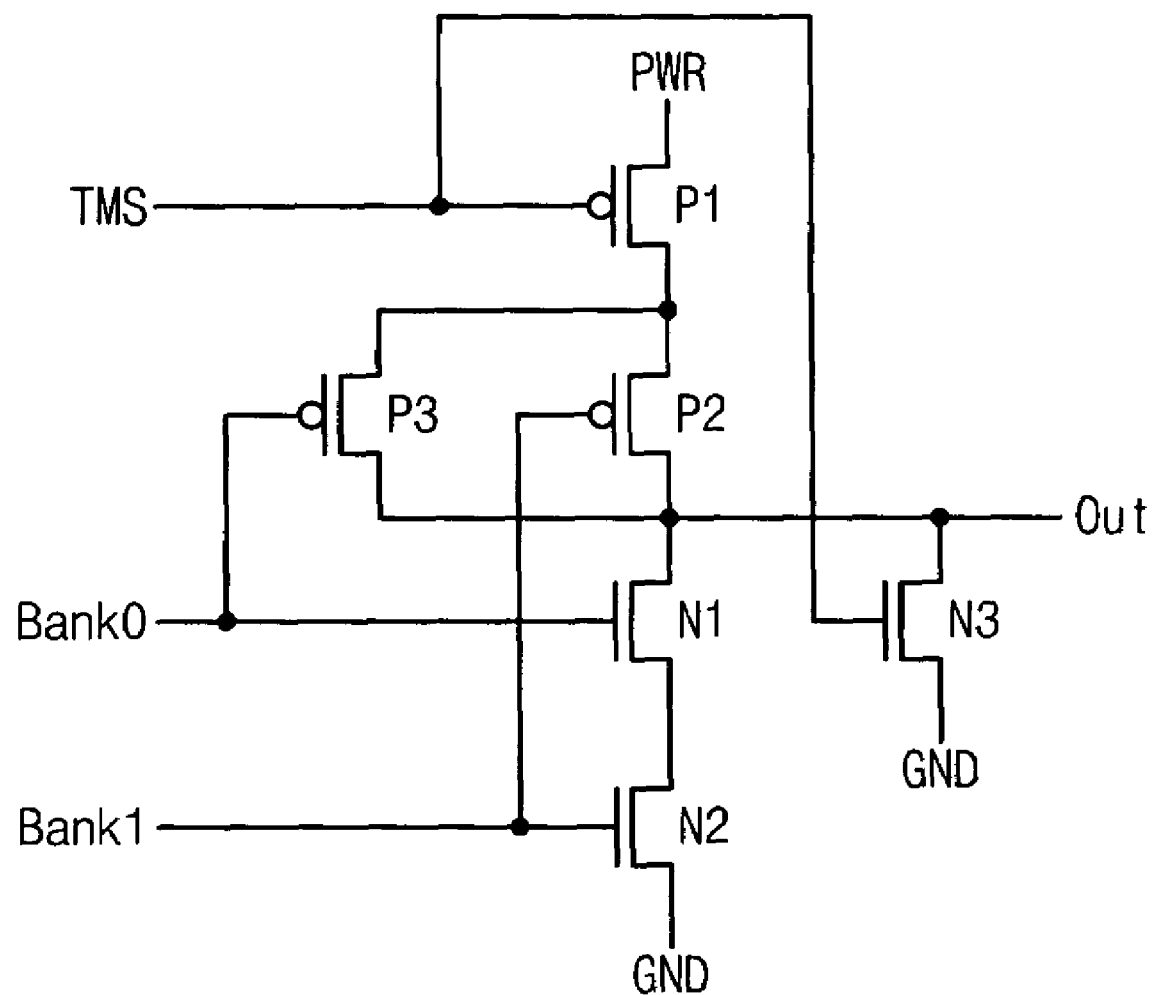
FIG. 6 is a circuit diagram illustrating a bank selecting unit of FIG. 5.

FIG. 6 is a circuit diagram illustrating one of the bank selecting units 200~500 of FIG. 5.

Figure 2:
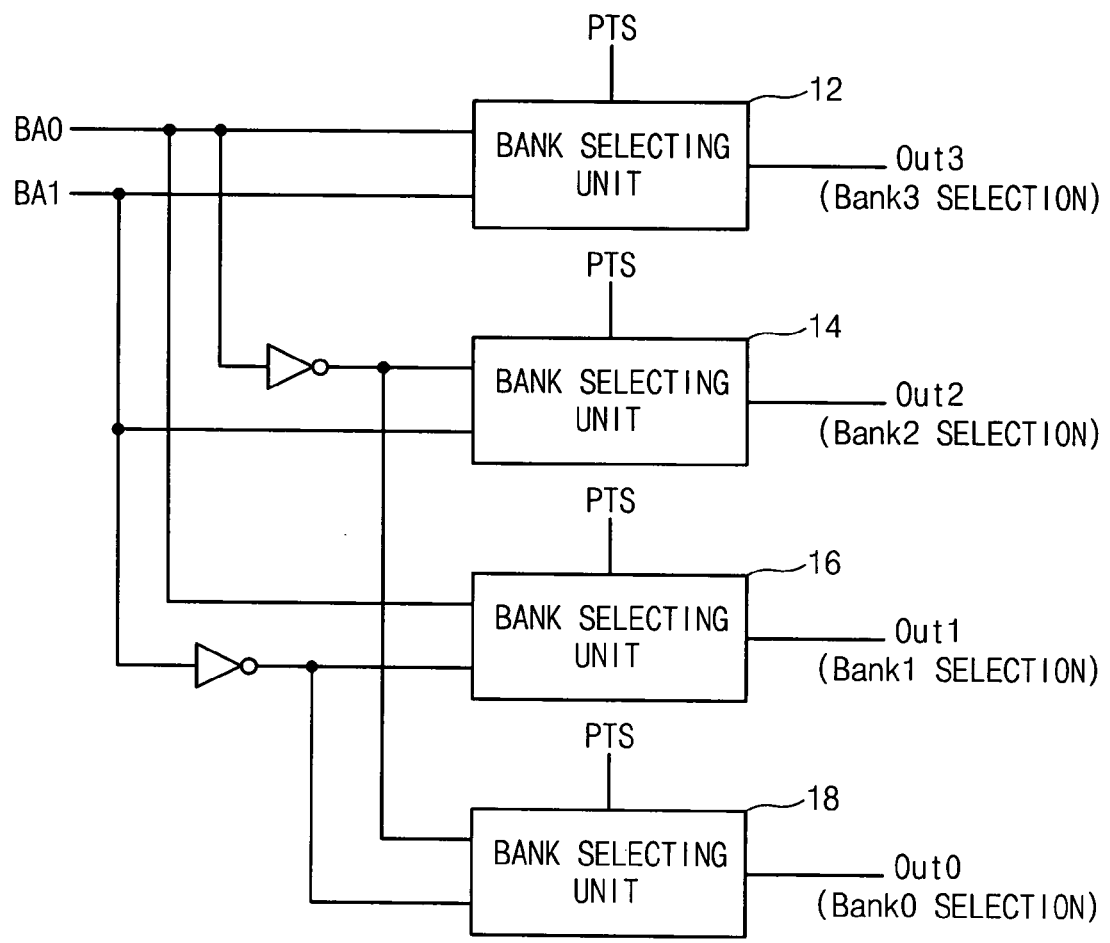
FIG. 2 is a circuit diagram illustrating a conventional parallel test circuit.
Figure 3:
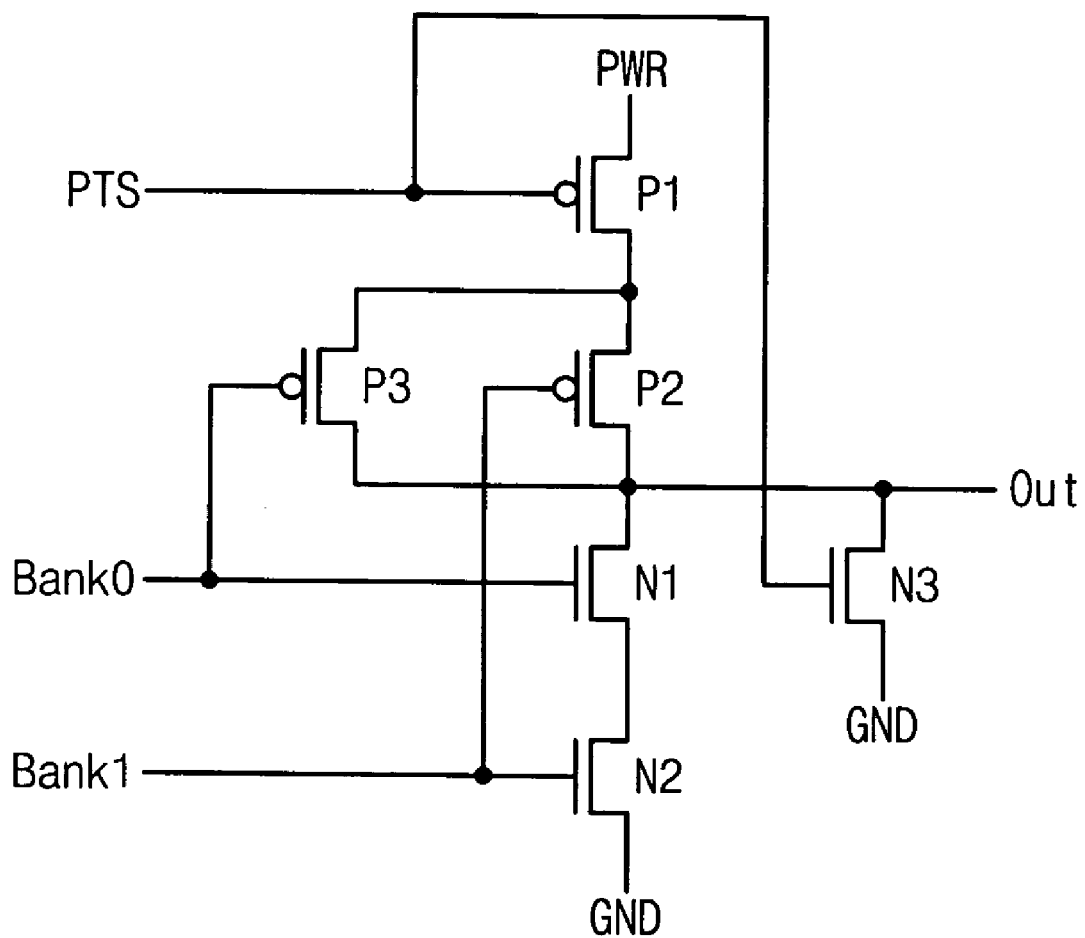
FIG. 3 is a circuit diagram illustrating a bank selecting unit of FIG. 2.

In an embodiment, each of the bank selecting units 200~500 has the same structure as that of each of the bank selecting units 12, 14, 16 and 18 in FIG. 2 except in that the test mode control signal TMS is applied instead of the parallel test signal PTS. Therefore, the reference numbers of each element of one of the bank selecting units 200~500 are the same as those of FIG. 3, and the explanation of FIG. 6 is omitted.

Figure 7A:
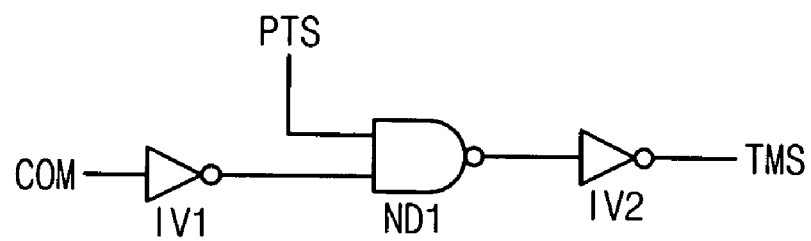
FIGS. 7a and 7b are circuit diagrams illustrating a bank selecting control unit according to first and second embodiments of the present invention.
Figure 7B:
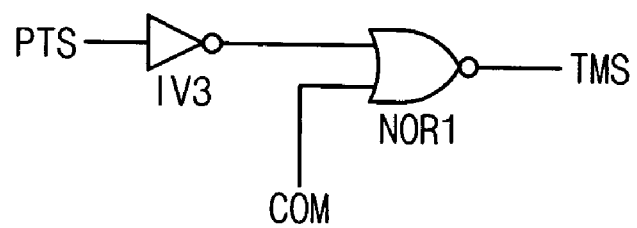

FIGS. 7a and 7b are circuit diagrams illustrating the bank selecting control unit 100 according to first and second embodiments of the present invention.

In an embodiment, the bank selecting control unit 100 outputs the test mode control signal TMS at the low level when the parallel test signal TMS and the compression test signal COM are all 'high'.

The bank selecting control unit 100 of FIG. 7a comprises an inverter IV1 for inverting the compression test signal COM, a NAND gate ND1 for performing a NAND operation on the parallel test signal PTS and an output signal from the inverter IV1, and an inverter IV2 for inverting an output signal from the NAND gate ND1 to output the test control signal TMS. The bank selecting control unit 100 of FIG. 7b comprises an inverter IV3 for inverting the parallel test signal PTS, and a NOR gate NOR1 for performing a NOR operation on the compression test signal COM and an output signal from the inverter IV3 to output the test control signal TMS.

In the embodiment, when the compression test signal COM is applied at a low level, all the banks B0~B3 are simultaneously selected to perform a parallel test.

Figure 8A:
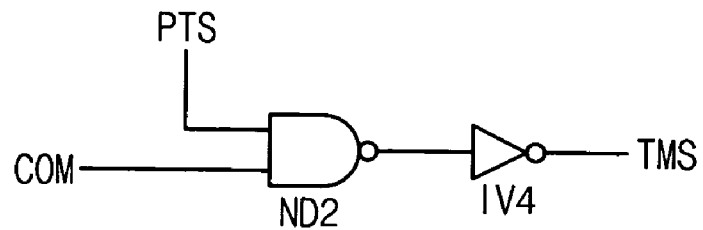
FIGS. 8a and 8b are circuit diagrams illustrating a bank selecting control unit according to third and fourth embodiments of the present invention.
Figure 8B:
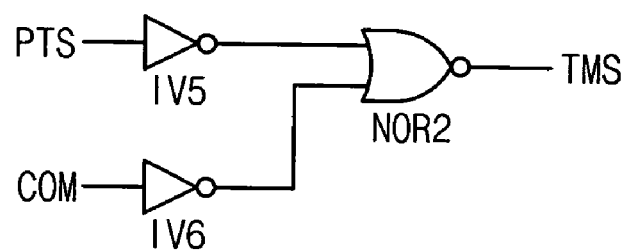

FIGS. 8a and 8b are circuit diagrams illustrating the bank selecting control unit 100 according to third and fourth embodiments of the present invention.

In an embodiment, the bank selecting control unit 100 outputs the test mode control signal TMS at the low level when the parallel test signal TMS is 'high' and the compression test signal COM is 'low'.

The bank selecting control unit 100 of FIG. 8a comprises a NAND gate ND2 for performing a NAND operation on the parallel test signal PTS and the compression test signal COM, and an inverter IV4 for inverting an output signal from the NAND gate ND2 to output the test control signal TMS. The bank selecting control unit 100 of FIG. 8b comprises an inverter IV5 for inverting the parallel test signal PTS, an inverter IV6 for inverting the compression test signal COM, and a NOR gate NOR2 for performing a NOR operation on output signals from the inverters IV5 and IV6 to output the test control signal TMS.

In the embodiment, when the compression test signal COM is applied at a high level, all the banks B0~B3 are simultaneously selected to perform a parallel test.

Figure 9A:
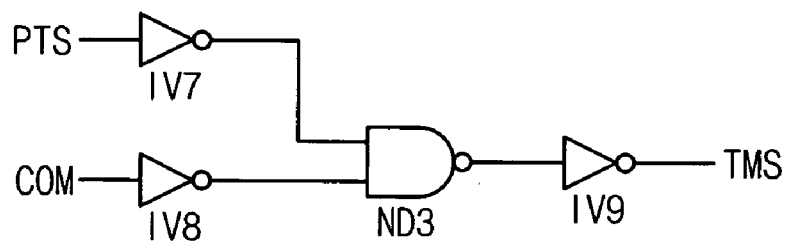
FIGS. 9a and 9b are circuit diagrams illustrating a bank selecting control unit according to fifth and sixth embodiments of the present invention.
Figure 9B:
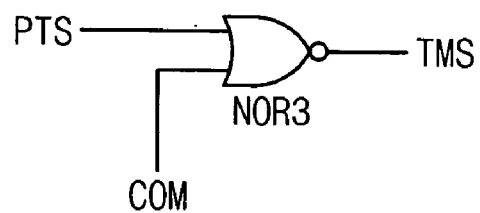

FIGS. 9a and 9b are circuit diagrams illustrating the bank selecting control unit 100 according to fifth and sixth embodiments of the present invention.

In an embodiment, the bank selecting control unit 100 outputs the test mode control signal TMS at the low level when the parallel test signal TMS is 'low' and the compression test signal COM is 'high'.

The bank selecting control unit 100 of FIG. 9a comprises an inverter IV7 for inverting the parallel test signal PTS, an inverter IV8 for inverting the compression test signal COM, a NAND gate ND3 for performing a NAND operation on output signals from the inverters IV7 and IV8, and an inverter IV9 for inverting an output signal from the NAND gate ND3 to output the test mode control signal TMS. The bank selecting control unit 100 of FIG. 9b comprises a NOR gate NOR3 for performing a NOR operation on the parallel test signal PTS and the compression test signal COM to output the test mode control signal TMS.

In the embodiment, when the compression test signal COM is applied at the low level, all the banks B0~B3 are simultaneously selected to perform a parallel test.

Figure 10A:
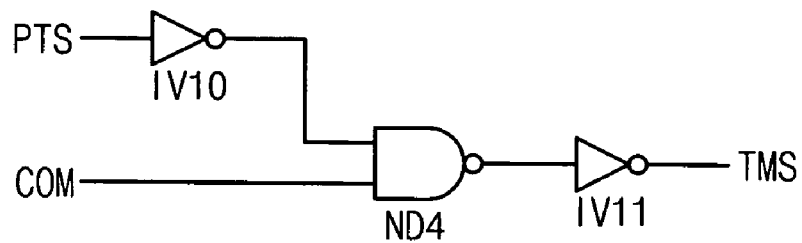
FIGS. 10a and 10b are circuit diagrams illustrating a bank selecting control unit according to seventh and eighth embodiments of the present invention.
Figure 10B:
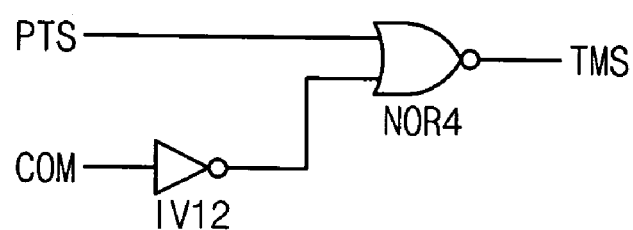

FIGS. 10a and 10b are circuit diagrams illustrating the bank selecting control unit 100 according to seventh and eighth embodiments of the present invention.

In an embodiment, the bank selecting control unit 100 outputs the test mode control signal TMS at the low level when the parallel test signal PTS and the compression test signal COM are all 'low'.

The bank selecting control unit 100 of FIG. 10*a* comprises an inverter IV10 for inverting the parallel test signal PTS, a NAND gate ND4 for performing a NAND operation on the compression test signal COM and an output signal from the inverter IV10, and an inverter IV11 for inverting an output signal from the NAND gate ND4 to output the test mode control signal TMS. The bank selecting control unit 100 of FIG. 10*b* comprises an inverter IV12 for inverting the compression test signal COM, and a NOR gate NOR4 for performing a NOR operation on the parallel test signal PTS and an output signal from the inverter IV12.

In the embodiment, when the compression test signal COM is applied at the high level, all the banks B0~B3 are simultaneously selected to perform a parallel test.

Figure 1:
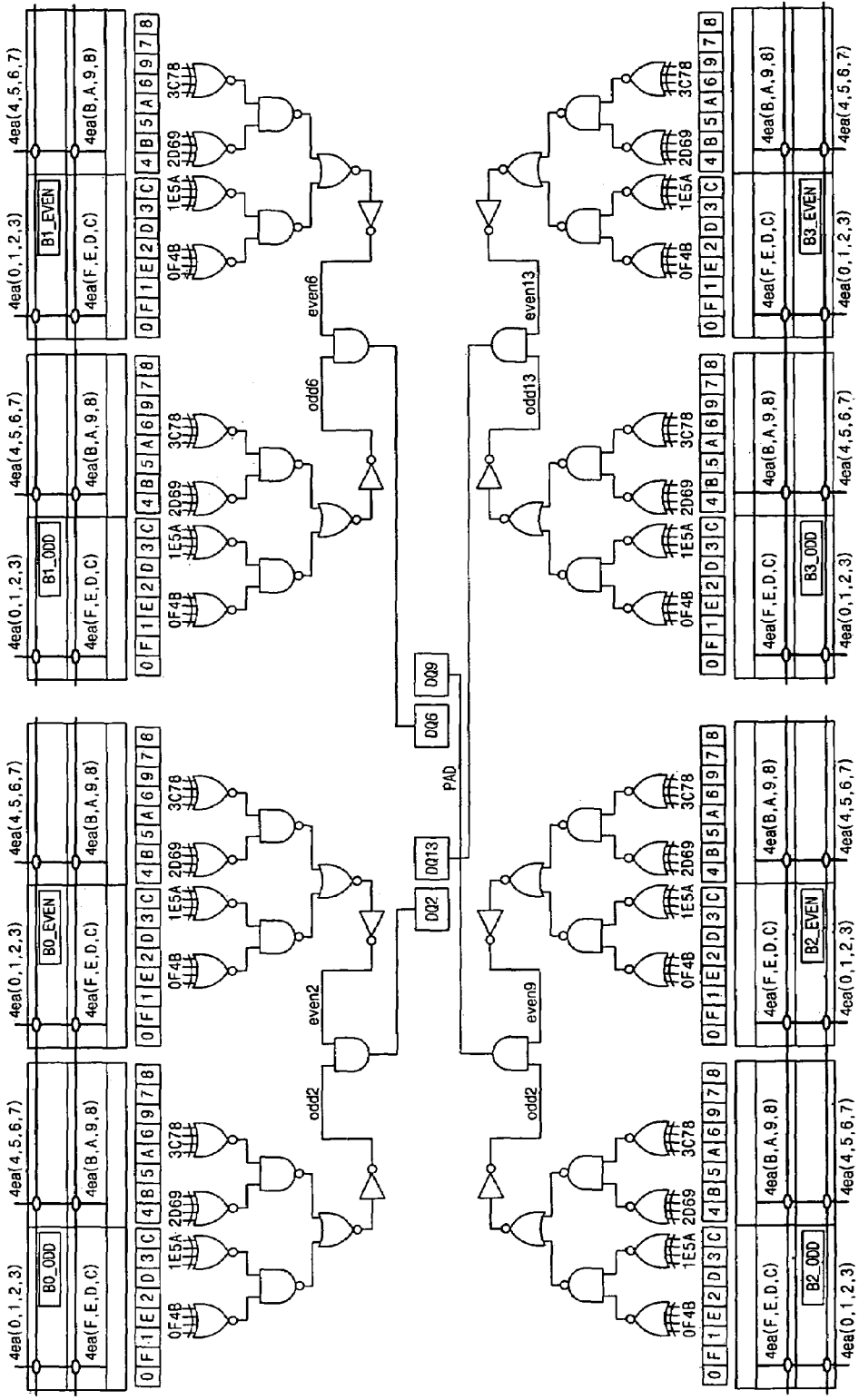
FIG. 1 is a block diagram illustrating a read operation of a conventional parallel test method.

As described above, the bank selecting control unit according to an embodiment of the present invention controls output of the parallel test signal PTS by the compression test signal COM, so that a specific bank is selectively tested even in the parallel test mode. Although FIG. 5 shows the main configuration of the bank selecting control unit, the whole structure diagram is omitted because the whole structure for a read operation of parallel test methods of a semiconductor memory device is similar to that of FIG. 1.

Figure 4:
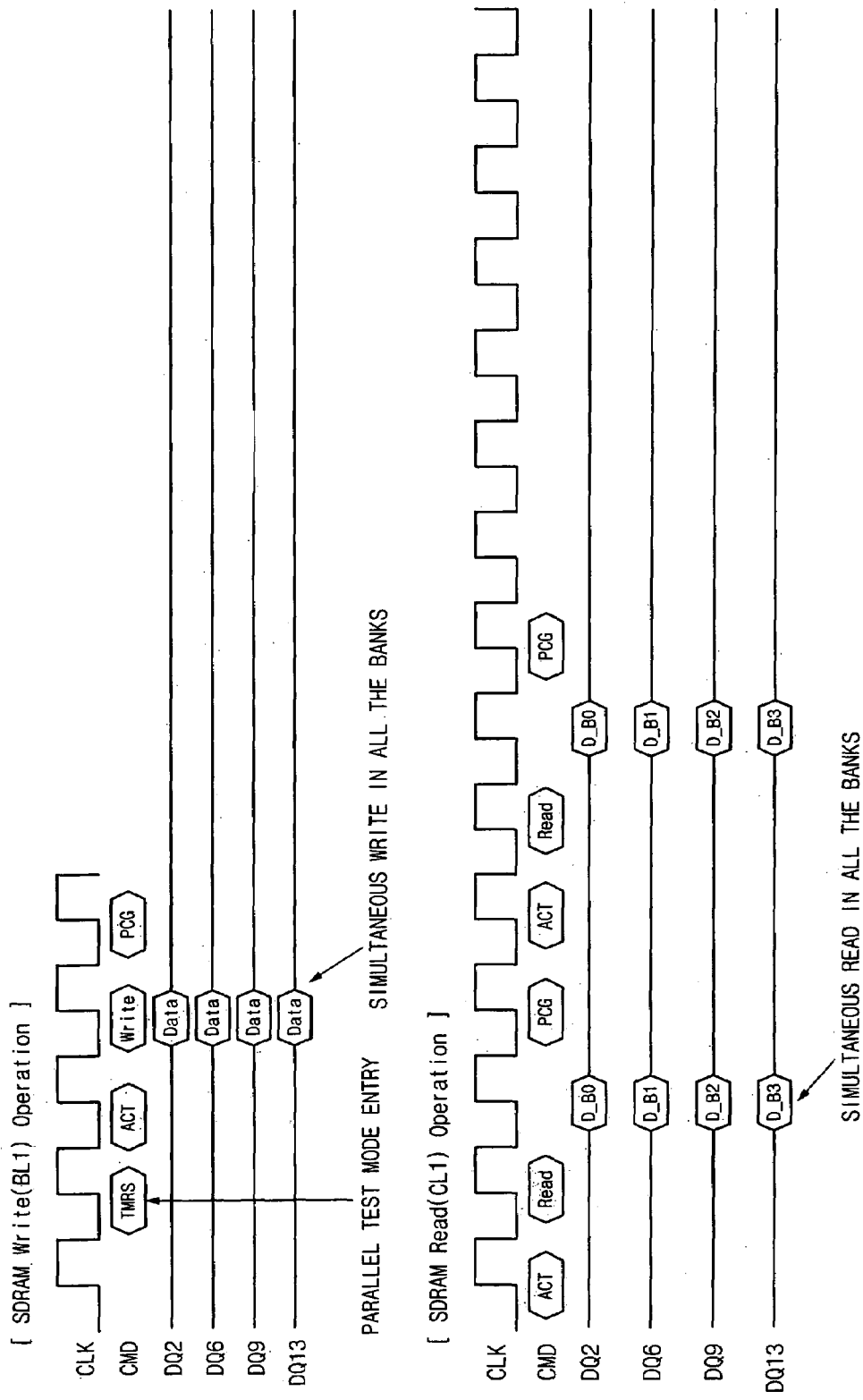
FIG. 4 is a timing diagram illustrating data write and read operations in the conventional parallel test.
Figure 11:
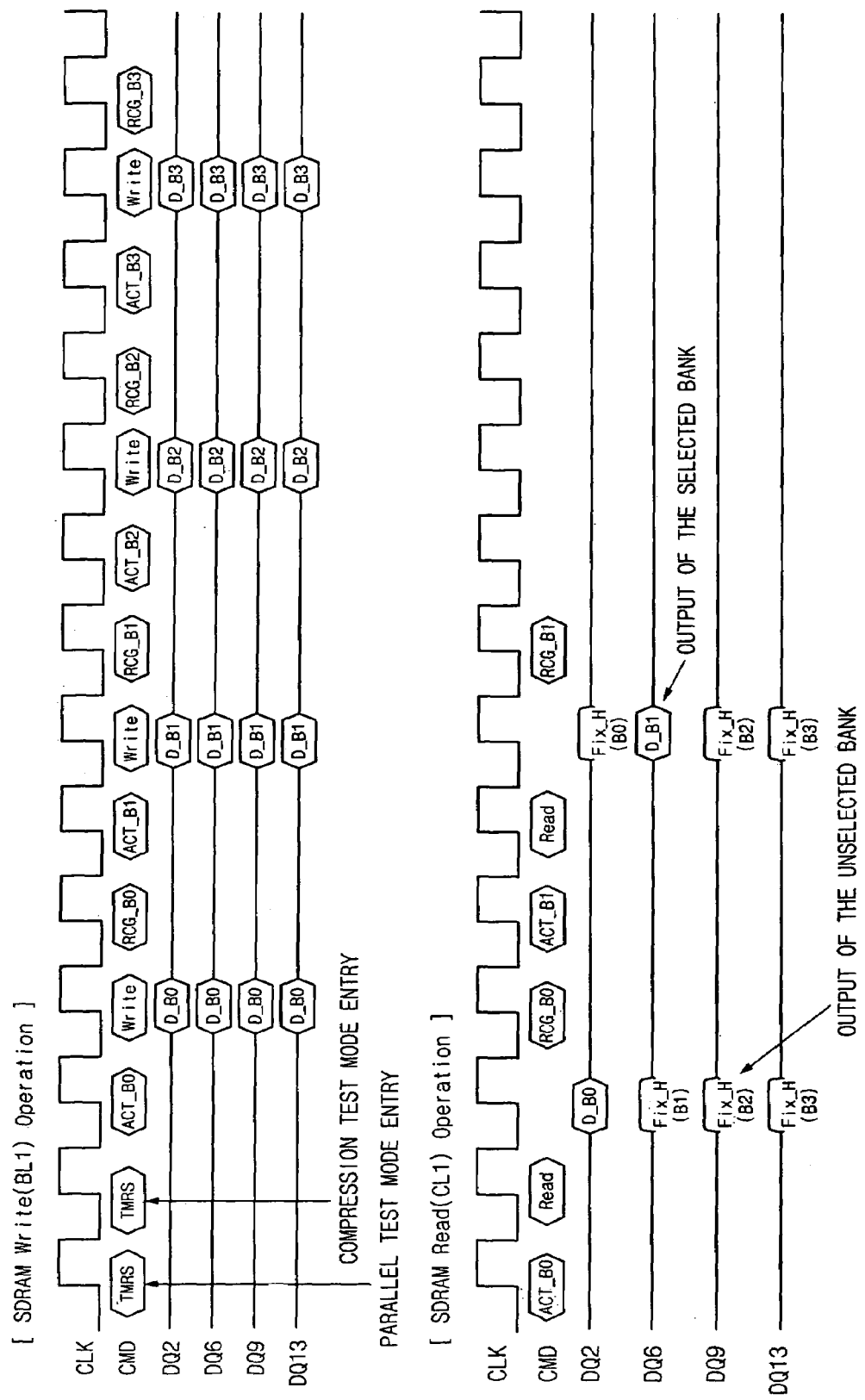
FIG. 11 is a timing diagram illustrating write and red operations in a compression test mode according to an embodiment of the present invention.

However, a method for selecting a specific bank in a parallel test mode according to an embodiment of the present invention is explained with reference to FIG. 11 compared with FIG. 4.

FIG. 11 is a timing diagram illustrating write and read operations in a compression test mode according to an embodiment of the present invention.

In an embodiment, if the parallel test signal PTS which represents entry of a parallel test mode is applied and then the compression test signal COM which represents entry of a compression test mode for selection of banks is applied, the memory test circuit performs a logic operation on the parallel test signal PTS and the compression test signal COM to control output of the test mode control signal TMS applied to the bank selecting units 200~500.

When the test mode control signal TMS is activated to 'high', the bank selecting units 200~500 activate the bank selecting signals Out0~Out3 all at the low levels to select all the banks B0~B3. However, when the test mode control signal TMS is inactivated to 'low', the bank selecting units 200~500 activate one of the bank selecting signals Out0~Out3 at the low level in response to the bank selecting control signals BA0~BA1, thereby selecting the corresponding bank to write or read data.

For example, the bank selecting control unit 100 in the first embodiment outputs the test mode control signal TMS at the low level to the bank selecting units 200~500 when the parallel test signal PTS and the compression test signal COM are activated to 'high'. When the test control signal TMS is applied at the low level, the PMOS transistor P1 is turned on and the NMOS transistor N3 is turned off in the bank selecting units 200~500. Then, the bank selecting signals Out0~Out3 outputted from the bank selecting units 200~500 are controlled by the bank selecting control signals BA0~BA1, so that a specific bank is selected and activated as shown in Table 1.

TABLE 1

|        | BA1 | BA0 |
|--------|-----|-----|
| BANK 0 | 0   | 0   |
| BANK 1 | 0   | 1   |
| BANK 2 | 1   | 0   |
| BANK 3 | 1   | 1   |

As a result, data applied through data pads DQ2, DQ6, DQ9 and DQD are written only in a specific bank activated in response to the bank selecting control signals BA0 and BA1 when a write command is applied.

At the read mode, only a specific bank which requires a test is activated in response to the bank selecting control signals BA0 and BA1, so that only the data of the corresponding bank is outputted through the corresponding data pad. Here, an output signal from the data pad corresponding to the unselected bank is fixed at a high level.

If the compression test signal COM is inactivated to 'low', the bank selecting control unit 100 outputs the test control signal TMS at the high level to the bank selecting units 200~500. As a result, the NMOS transistor N3 of the bank selecting units 200~500 is turned on, and then the bank selecting signals Out0~Out3 are outputted all at the low levels regardless of the bank selecting control signals BA0 and BA1, so that all the banks B0~B3 are simultaneously selected and tested.

As described above, a bank selectable parallel test circuit according to an embodiment of the present invention can perform a selective test on a desired specific bank by combining the compression test signal and the parallel test signal, thereby reducing the defect analysis time on various chips and also saving the test cost.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A bank selectable parallel test circuit comprising:
a bank selecting control unit for outputting a test mode control signal for selecting a test mode in response to a parallel test signal for controlling a parallel test and a compression test signal for controlling bank selection in the parallel test; and
a plurality of bank selecting units, corresponding one by one to banks, for selectively activating the corresponding banks in response to the test mode control signal and a bank selecting control signal to selectively test a specific bank even in a parallel test mode.

2. The bank selectable parallel test circuit according to claim 1, wherein the bank selecting control unit outputs the test mode control signal when the parallel test signal is activated earlier than the compression test signal.

3. The bank selectable parallel test circuit according to claim 1, wherein each output signal from the plurality of bank selecting units is disabled by the parallel test signal at the parallel test mode.

4. The bank selectable parallel test circuit according to claim 1, wherein the plurality of bank selecting units simultaneously select all banks when the test mode control signal is activated, and select a specific bank in response to the bank selecting control signal when the test mode control signal is inactivated.

5. The bank selectable parallel test circuit according to claim 4, wherein each of the plurality of bank selecting units comprises:
   first through fourth switching devices which are serially connected between a power voltage terminal and a ground voltage terminal and controlled by the test mode signal and the bank selecting control signal;
   a fifth switching device which is connected in parallel to the second switching device and controlled by the bank selecting control signal; and
   a sixth switching device whose one terminal is connected to an output terminal of the fifth switching device and whose other terminal receives a ground voltage and which is controlled by the test mode signal.

6. The bank selectable parallel test circuit according to claim 5, wherein the first switching device, the second switching device and the fifth switching device are individually PMOS transistors.

7. The bank selectable parallel test circuit according to claim 5, wherein the third switching device, the fourth switching device and the sixth switching device are individually NMOS transistors.

8. The bank selectable parallel test circuit according to claim 1, wherein the bank selecting control unit comprises a logic operation unit for outputting the test mode control signal according to the parallel test signal and the compression test signal.

9. The bank selectable parallel test circuit according to claim 8, wherein the logic operation unit comprises:
   a first inverting unit for inverting the compression test signal;
   a NAND gate for performing a NAND operation on the parallel test signal and an output signal from the first inverter; and
   a second inverting unit for inverting an output signal from the NAND gate.

10. The bank selectable parallel test circuit according to claim 8, wherein the logic operation unit comprises:
    a first inverting unit for inverting the parallel test signal; and
    a NOR gate for performing a NOR operation on the compression test signal and an output signal from the first inverting unit.

11. The bank selectable parallel test circuit according to claim 8, wherein the logic operation unit comprises:
    a NAND gate for performing a NAND operation on the parallel test signal and the compression test signal; and
    an inverting unit for inverting an output signal from the NAND gate.

12. The bank selectable parallel test circuit according to claim 8, wherein the logic operation unit comprises:
    a first inverting unit for inverting the parallel test signal;
    a second inverting unit for inverting the compression test signal; and
    a NOR gate for performing a NOR operation on output signal from the first inverting unit and the second inverting unit.

13. The bank selectable parallel test circuit according to claim 8, wherein the logic operation unit comprises a NOR gate for performing a NOR operation on the parallel test signal and the compression test signal.

14. The bank selectable parallel test circuit according to claim 8, wherein the logic operation unit comprises:
    a first inverting unit for inverting the parallel test signal;
    a NAND gate for performing a NAND operation on the compression test signal and an output signal from the first inverting unit; and
    a second inverting unit for inverting an output signal from the NAND gate.

15. The bank selectable parallel test circuit according to claim 8, wherein the logic operation unit comprises:
    an inverting unit for inverting the compression test signal; and
    a NOR gate for performing a NOR operation on the parallel test signal and an output signal from the inverting unit.

16. A parallel test method comprising the steps of:
    performing a logic operation on a parallel test signal for controlling a parallel test and a compression test signal for controlling bank selection to output a test mode control signal;
    activating all bank selecting signals when the test mode control signal is activated to simultaneously select all banks, and activating a bank selecting signal corresponding to a specific bank in response to a bank selecting control signal when the test mode control signal is inactivated to select a corresponding bank; and
    writing/reading data in the selected bank to test the selected bank.

17. The parallel test method according to claim 16, wherein a specific bank is selectively tested in response to the compression test signal even when the parallel test signal is applied.

18. The parallel test method according to claim 16, wherein the parallel test signal is activated earlier than the compression test signal.

19. The parallel test method according to claim 16, wherein each output signal from the plurality of bank selecting units is disabled by the parallel test signal at the parallel test mode.

* * * * *